(12) United States Patent
Janz et al.

(10) Patent No.: US 6,331,445 B1
(45) Date of Patent: Dec. 18, 2001

(54) PHOTOTONIC DEVICE WITH STRAIN-INDUCED THREE DIMENSIONAL GROWTH MORPHOLOGY

(75) Inventors: Siegfried Janz, Gloucester; Hughes Lafontaine, Ottawa; Dan-Xia Xu, Gloucester, all of (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/306,732

(22) Filed: May 7, 1999

(51) Int. Cl.[7] .................................................. H01L 21/20
(52) U.S. Cl. ............................... 438/57; 438/483
(58) Field of Search .................... 438/57, 48, 65, 438/69, 71, 91, 94, 478, 481, 483

(56) References Cited

U.S. PATENT DOCUMENTS 6,130,441 * 10/2000 Boweres et al. ................... 257/94

* cited by examiner

Primary Examiner—Savitri Mulpuri
(74) Attorney, Agent, or Firm—Marks & Clerk

(57) ABSTRACT

In order to fabricate a photonic device with an enhanced photoresponse at 155 nm, a plurality of undulating quantum well layers are grown on said substrate in a three dimensional growth mode to defeat the limitations imposed by strain on the maximum layer thickness. The quantum wells typically are formed by epitaxially growing alternating layers of $Si_{1-x}Ge_x$, and Si on a silicon substrate.

12 Claims, 4 Drawing Sheets

PHOTOTONIC DEVICE WITH STRAIN-INDUCED THREE DIMENSIONAL GROWTH MORPHOLOGY

FIELD OF THE INVENTION

This invention relates to a method of fabricating a photonic device on a substrate to permit the integration with signal processing electronics.

BACKGROUND OF THE INVENTION

CMOS (Complementary Metal Oxide Semiconductor) technology forms the basis of modem integrated circuits and signal processing electronics. CMOS technology has the advantage it consumes very little power, and therefore a large number of transistors can be packed onto a single chip.

Photodetectors are of increasing importance in the field of telecommunications with the advent of optic fiber communications. It would be very useful to fabricate photodetectors for telecommunications applications on a silicon wafer, for example, using SiGe epitaxial layers. If this were possible, the CMOS signal processing electronics could be integrated with the photodetectors on a single chip. Such photodetectors and any associated electronics could also be combined with Si compatible waveguides (e.g. silicon-on-insulator, Si/SiGe/Si, or silica-on-silicon), to create fully integrated optoelectronic modules.

Silicon-germanium (SiGe) alloys have been used for a number of years in the manufacturing of heterojunction bi-polar transistors with considerable success because the introduction of germanium provides more than a doubling of device speed, while preserving 100% compatibility with existing processing technology. SiGe alloys are also attractive for the monolithic integration of Si photonics with mainstream very large scale integrated (VLSI) technology because the addition of Ge extends the wavelength range of silicon, and SiGe/Si multiquantum wells (MQW's) can be epitaxially grown coherent with the Si substrate presenting an additional degree of freedom in band-gap engineering.

The main limitation of this material system for photonic devices is the strain which restricts the thickness and germanium concentration that can be incorporated into a MQW structure. At the large Ge concentrations (>0.5) needed to extend the absorption wavelength to 1.55 μm, the thickness of one strained layer which can be grown without dislocations is limited to 10–20 nm, depending on growth rate and temperature, but the critical thickness becomes even smaller when more than one strained layer is grown in a MQW structure. Dislocations are generally fatal to electronic device performance and cause a large dark current in photodetectors. It has also been reported that surface rippling (Stranski-Krastanov growth) limits planar strained growth to an even smaller critical thickness at Ge concentrations higher than 0.25. The small SiGe well thickness in turn produces a large quantum confinement shift which pushes the band gap to larger energy and thus the absorption threshold to lower wavelengths. Possible solutions are to grow the MQW layers on relaxed buffer layers, allowing for relatively defect free, thick SiGe layers to be grown, or to incorporate carbon into the layers thus compensating for the lattice mismatch introduced by Ge. However, strain is known to decrease the band-gap energy, and relaxed layers would need to contain even more Ge in order to have a band gap similar to strained material.

Over the last few years, Stranski-Krastanov three-dimensional (3D) growth of SiGe has been used to produce dislocation-free strained material, but applications in optoelectronics are yet to be seen. Only limited data have been published so far showing phonon resolved photoluminescence at low energy (<900 meV) from 3D SiGe growth and the band-gap energy obtained was larger than the predicted value for planar growth, making optoelectronic applications even more difficult. In particular, it has been difficult or impossible to fabricate photodetectors or light emitting devices on Si substrates that are useful in the λ=1550 nm telecommunications wavelength band. The reason for this is that only $Si_{1-x}Ge_x$ alloys with high Ge (germanium) concentrations (x>0.5) have energy gaps small enough to be sensitive to light at λ=1550 nm (0.8 eV). Unfortunately, the large lattice mismatch between Si and Ge means that only very thin $Si_{1-x}Ge_x$ layers can be grown epitaxially on Si at high Ge concentrations. Exceeding this critical thickness limit results in the formation of dislocations, which degrade photodetector performance. The quantum confinement effect in such thin layers also moves the optical absorption edge to shorter wavelengths, counteracting the effect of increasing the Ge concentration.

SiGe photodetectors for 1550 nm have been fabricated using relaxed buffer layers under the photodetector structure. These buffer layers are used to localize dislocations to within the buffer layer itself and prevent them from threading to the surface through the active photodetector. The drawback of this approach is that the active SiGe layer is also relaxed and has a higher band gap than would be achieved using fully strained growth. As a result, either thicker layers and/or a higher Ge concentration are required to achieve a usable photodetector response. The buffer layers are also quite thick, and their presence can limit the possibilities for subsequent integration with electronics and optical waveguides.

The only other possibility for integrating photodetectors on Si is to use hybrid integration techniques to place III-V semiconductor detectors on a Si wafer. Although this is technically possible, hybrid integration is a rather expensive manufacturing technology, which is not yet really suited to mass production.

An object of the invention is to provide a method of fabricating a photonic device with enhanced photoresponse at longer wavelengths, in particular 1550 nm, on a silicon substrate.

SUMMARY OF THE INVENTION

According to the present invention there is provided a method of fabricating a photonic device comprising the steps of providing a substrate and providing a quantum well structure on said substrate by alternately growing layers of a first material and a second material providing a barrier layer, said first material forming quantum wells and comprising at least two components, and said layers of said first material being grown in a three dimensional morphology growth mode such that the thickness of said layers of said first material varies over the surface thereof to reduce local strain energy and increase local concentrations of one of said components.

The three dimensional growth mode permits the limitations imposed by strain on the maximum layer thickness to be defeated.

Under the appropriate conditions during growth of lattice mismatched materials, strain will cause an epilayer to take on a three dimensional morphology. Epilayers may grow with "coherent wave" thickness modulations, as islands on a wetting layer (Stranski-Krastanow), or as isolated islands (Volmer-Weber). These effects have been exploited to fabricate "self-assembled" quantum-dots. A key point that has been overlooked in the prior art is that the 3D growth morphology reduces local strain energy and permits the growth of epilayers with higher local Ge concentration and local epilayer thickness than otherwise possible. This effect is exploited to advantage in the invention.

Advantageously, the substrate is silicon and the first material is $Si_{1-x}Ge_x$, where x is as large as possible. A current value typically is about 0.5.

SiGe quantum wells with ,"ncoherent wave" thickness modulations have lower band gaps than uniform quantum wells with the same nominal thickness and Ge concentration. This is attributed to a reduction of quantum confinement at the wave crests, and the migration of Ge to the wave crests. In accordance with the invention, the SiGe quantum wells superlattices are grown in one of these 3D growth modes. The resulting heterostructure permits the fabrication of a photodetector with enhanced photoresponse at 1550 nm. Band-gaps as low as 0.787 eV have been measured by photoluminescence.

Studies have shown that coherent wave growth can be used to create strained SiGE superlattices with band gaps below 800 meV ($\lambda$=1550nm). A prototype MSW waveguide detector has been fabricated and tested, yielding a photoresponse of approximately 0.05 A/W at a wavelength of 1550 nm. The optical quality of the material obtained suggests that it can be used to manufacture absorbing photonic devices such as a PIN waveguide photodetector.

The invention also provides a photonic device comprising a substrate; and a quantum well structure formed on said substrate as alternate layers of a first material forming the quantum wells, said layers of said first material having thickness modulations over the surface thereof to reduce local strain energy, and a second material providing a barrier layer.

BRIEF DESCRIPTION OF THE DRAWINGS

The invention will now be described in more detail, by way of example only, with reference to the accompanying drawings, in which:FIG.

DETAILED DESCRIPTION OF THE PREFERRED EMBODIMENTS

Figure 1:
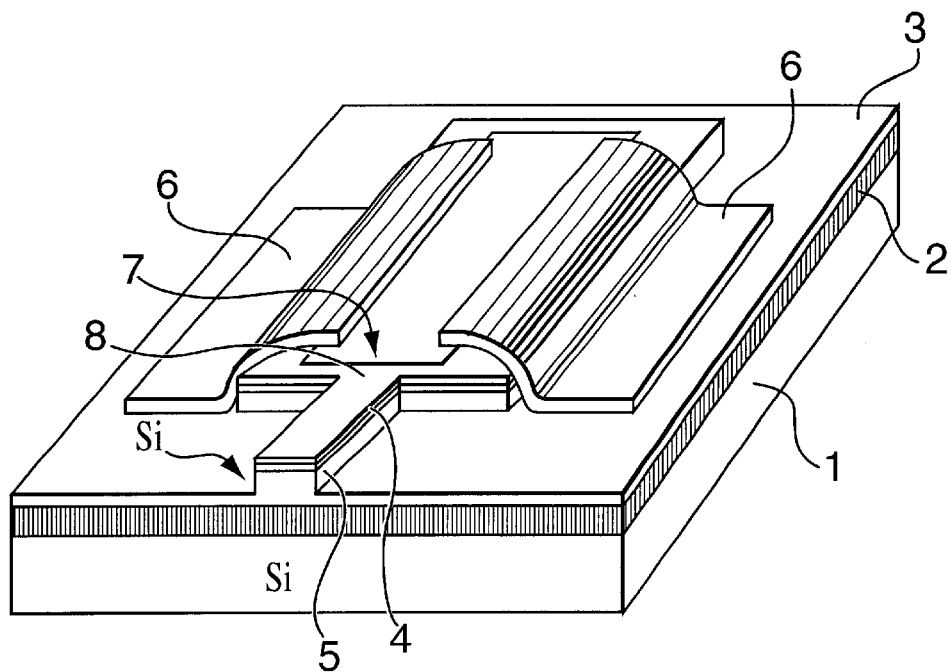
FIG. 1 is a perspective view of an undulating waveguide photodetector grown on a SOI substrate.

In FIG. 1, an undulating MSM (Metal-Semiconductor-Metal) waveguide photodetector comprises a substrate 1, a buried oxide layer 2, and a silicon buffer layer 3. A SiGe multiple quantum well superlattice structure 4 consisting of alternate layers of $Si_{1-x}Ge_x$, and Si is formed on the silicon buffer layer 3. A rectangular waveguide structure 7 is formed by etching from the superlattice 4 and part of the buffer layer 3 to leave an extension 5 of the layer 3 lying under the superlattice. Curved metal contact pads 6 extend over the limbs of the waveguide structure.

In a specific example, bonded silcon-on-insulator (SOI) wafers were used as substrates. The initial Si thickness was 1.8 $\mu$m and the buried oxide layer thickness was 1.1 $\mu$m. The silicon layer 3 was boron doped to a resistivity of 4–6 $\Omega$ cm.

$Si_{0.5}Ge_{0.5}$ quantum wells 4 with undulating thickness were grown at 525° C. using a production-compatible, ultrahigh vacuum chemical vapor deposition system (J. Vac. Sci. Technolg. B 9, 2048 (1991). The growth chamber consists of a quartz tube heated by a furnace and evacuated by a turbomolecular roots blower/rotary pump system.

The base pressure between runs was typically below $1.0 \times 10^{-9}$ mbar at T=525° C. Silane (100%) and germane (10% in helium), were used as precursors at a pressure of 1mTorr. After a standard "RCA" clean and a HF:H$_2$O (1 10) bath for 10 s, wafers are introduced into the chamber through a loadlock. Growth was initiated immediately after the transfer is completed, by SiH$_4$ injection. The growth rates obtained are small and vary drastically with Ge composition. Si barrier layers were grown at 1.2 nm/min, whereas the $Si_{0.5}Ge_{0.5}$ layers were grown at 4 nm/min.

The growth conditions and heterostructure specifications were chosen based on experimental and theoretical results (Mater. Res. Soc. Symp. Proc. 399, 413 (1966). A composition of 50% Ge was chosen because of the latitude in layer thickness and the large amount of germanium that can be incorporated in undulating layers without misfit dislocations.

The detector structure 7 consists of a 10 period quantum well superlattice with 5 nm thick $Si_{0.5}Ge_{0.5}$ wells and 12.5 nm thick barriers. It was then capped with a 25 nm thick silicon layer 8.

The waveguide structure was formed by reactive ion etch (RIE) in a Cl$_2$ and O$_2$ mixture. The etch rate was ~100 nm/min and the etch depth was 1.5 $\mu$m, which gave good optical confinement in the lateral direction. The width of the ridges was 5 $\mu$m at the guiding section and 65 $\mu$m at the collection section. A layer of oxide was then deposited by plasma enhanced chemical vapor deposition (PECVD) for electrical insulation. A window of 27 $\mu$m×260 $\mu$m was opened for contact. Schottky contacts to the Si cap layer were formed with an electron-beam evaporated Al layer. Samples were then sintered at 420° C. for 20 sec in forming gas. For initial evaluation, only simple Al pads were used for Schottky contact. The use of closely spaced interdigitated fingers would lend the devices to faster response. The distance between the pads 6 was 19 $\mu$m, and the length of the collection region was 240 $\mu$m. The contact area at each electrode was thus 4×240 $\mu$m$^2$. After the ridges and the metal pads were formed, the samples were thinned down and cleaved to produce optical facets.

Photocurrent/responsivity measurements were carried out using light from one of two tunable external cavity semiconductor lasers. One laser was tunable over the wavelength range from $\lambda$=1280 nm to 1330 nm while the second covered the range from $\lambda$=1480 nm to 1580 nm. Both laser outputs were coupled into single-mode optical fiber, and the laser power was monitored by measuring the 10% output of a 90%/10% fiber splitter with a power meter. Light in the 90% arm was focussed onto the photodetector waveguide input facet using a tapered fiber tip with a 5 $\mu$m tip radius. The fiber tip was mounted on a computer controlled translation stage. The coupling efficiency of light from the fiber tip into waveguide is normally determined by the overlap integral of the fiber mode (at the waveguide facet) and the waveguide mode. This overlap integral was measured directly by monitoring the photocurrent as the fiber was translated in the vertical direction. The coupling of light into the photodetector waveguide can then be estimated by fitting a calculated trial overlap integral (with fiber mode size as the only adjustable parameter) to the measured overlap integral, and including the Si waveguide facet reflectivity. In our case the 2 $\mu$m thick SOI waveguide is highly multimode, so we replaced the waveguide mode in the calculated overlap integral by 2 $\mu$m wide square top hat function. The estimated total coupling efficiency was typically in the range of 20%, and could reach a maximum of near 30%. The incident laser sources were modulated using an external LiNbO$_3$ Mach-Zehnder modulator in the case of the $\lambda$=1300 nm laser, and by direct current modulation for the $\lambda$=1550 nm laser. The generated photodetector current was fed into a transimpedance amplifier, and the transimpedance amplifier output was fed to a lock-in amplifier synchronized to the laser modulation signal. This arrangement allowed us to isolate the photocurrent response from electrical and optical noise sources and the dark-current background.

Photocurrent spectra were obtained between $\lambda$=1200 nm and $\lambda$=1600 nm using a quartz-halogen white light source coupled into a monochromator. After passing through a optical chopper, and a Si filter to remove residual short wavelength light, the monochromator output was coupled into a 200 $\mu$m core multimode fiber. The photodetector input facet was illuminated by the output beam of this fiber. The experimental arrangement for collecting photocurrent was otherwise identical to that described previously.

The material properties of the wafer were characterised by various methods. Photoluminescence spectra were recorded using a Fourier transform infrared spectrometer with the samples in cold helium gas (T~4.5 K). The excitation wavelength was 514 nm (Ar$^+$ laser) and the power density at the sample was 10–100 mW/cm$^2$.

Figure 2:
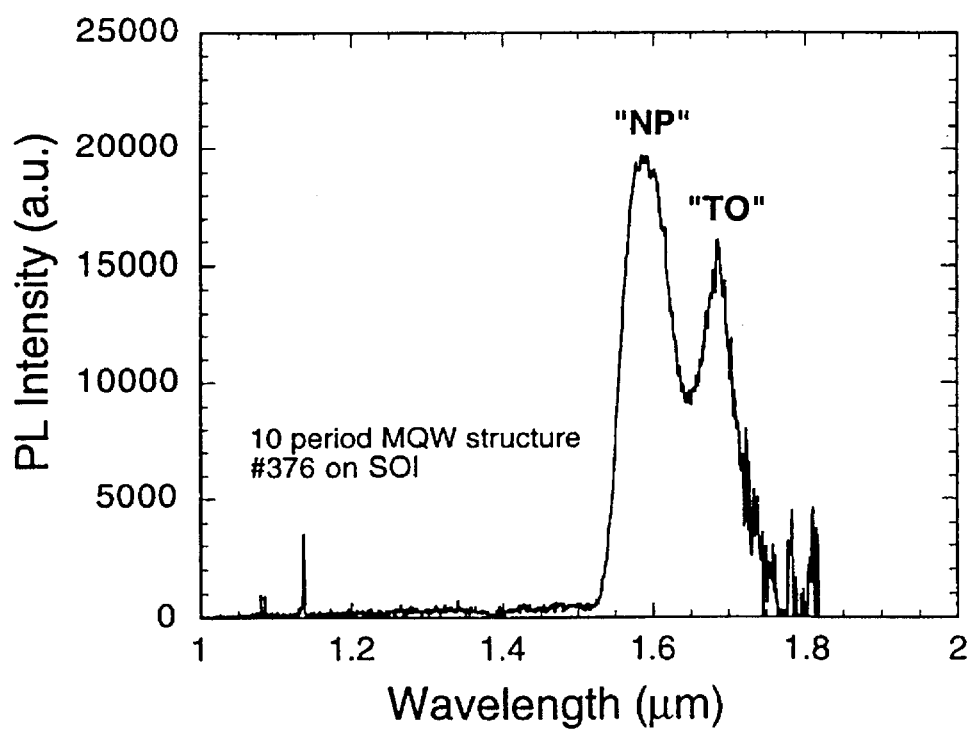
FIG. 2 shows the photoluminescence spectra of different $Si_{0.5}Ge_{0.5}$/Si MQW structure with an excitation energy of 10 mW/cm$^2$.

FIG. 2 shows the photoluminescence spectrum observed from the structure with 10 mW/cm$^2$ excitation power. Two main peaks are seen, labelled 'NP' and 'TO' respectively for the direct no-phonon excitonic transition and the transition assisted with a transverse optical phonon. The energies/wavelengths of these peaks are directly related to the bandgap of the material, its strain, and the confinement shift due to the quantum wells. The wavelength of the 'NP' peak near 1.55 $\mu$m corresponds to an energy of 0.785 eV at 4° K (the room temperature bandgap should be ~0.745 eV). It should also be noted that no dislocation associated emission lines were seen here, although they could appear with larger well thicknesses.

Cross-sectional transmission electron microscopy (TEM) and atomic force microscopy (AFM) were also conducted. TEM images showed that the SiGe layers have ripples with thickness modulations as large as 10 nm. The Si barrier layers were not thick enough to planarize the growth surface, and this in turn favors vertical ordering and self organization of the undulations into more uniform sizes and lateral distribution. The coherent wavelength in the plane is on the order of 100 nm.

Figure 3:
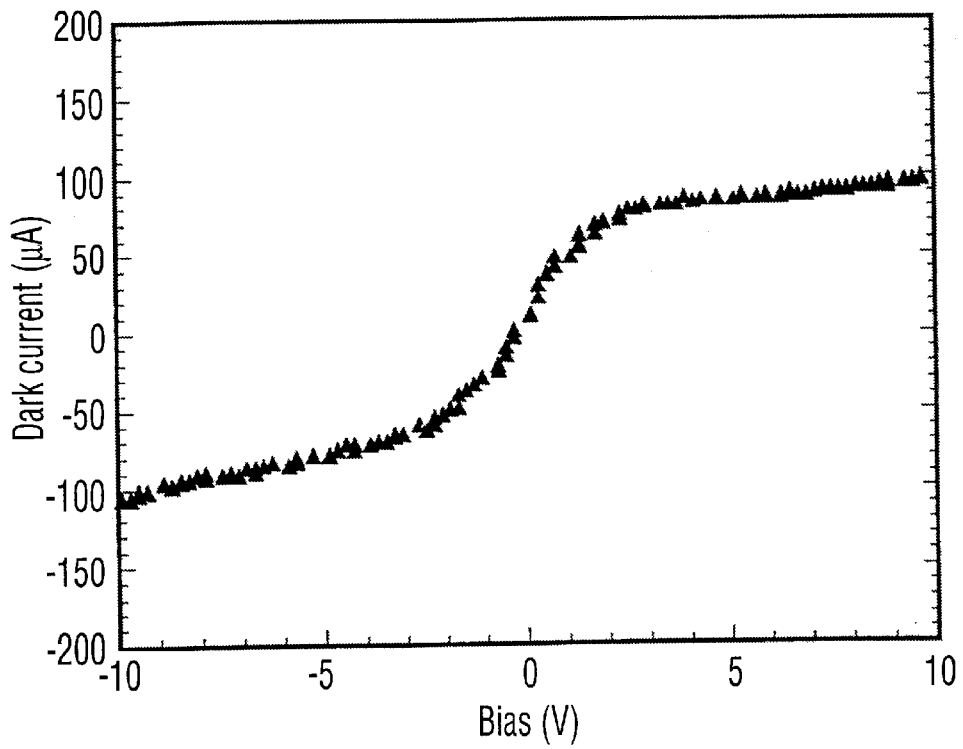
FIG. 3 shows dark current vs. bias for the photodetector.

The dark current of a MSM diode is shown in FIG. 3. It is of typical behavior for a Schottky MSM diode, with the current saturating under higher bias. The present sample surface is rougher than plain Si, probably because the Si cap layer is very thin (25 nm) and the SiGe undulation has not yet been planarized. This roughness may have caused the higher dark current ($\leq 0.1 \mu A/\mu m^2$). A thicker Si cap layer should improve the device electrical performance.

Figure 4:
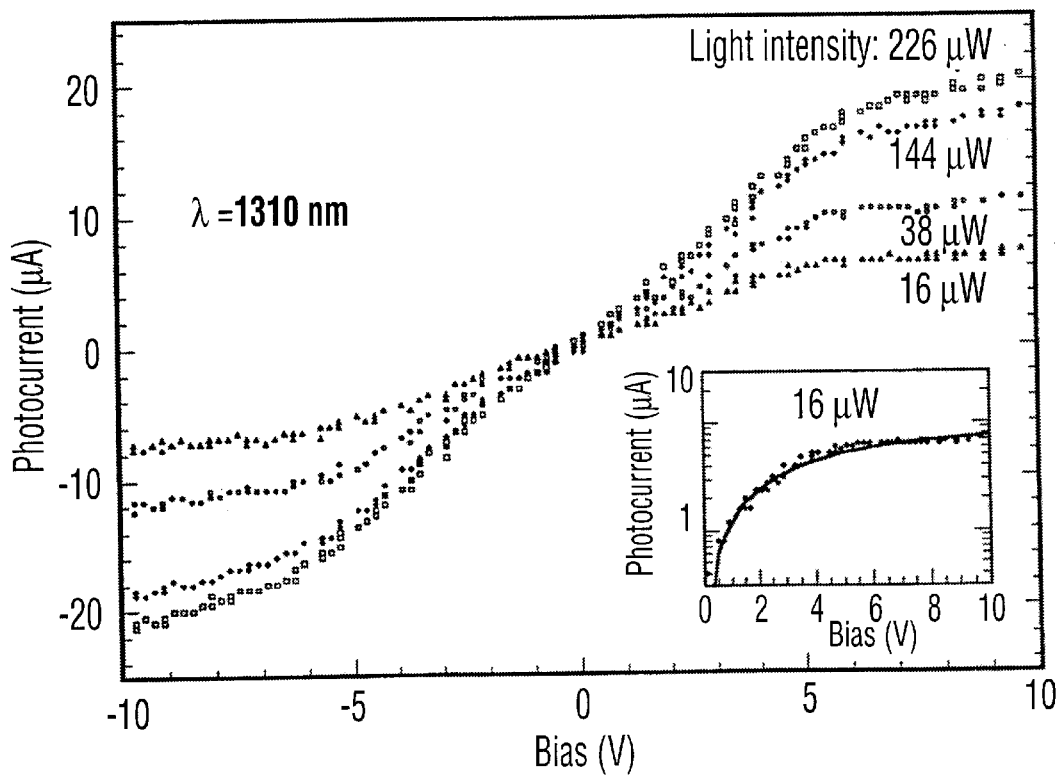
FIG. 4 shows the dependence of photocurrent on bias for different illumination levels at 1310 nm wavelength.

FIG. 4 illustrates the photocurrent dependence on electrical field for different illumination power at $\lambda$=1310 nm. At low bias, photocurrent increases linearly with voltage as the electric field gets stronger and sweep more photo-generated carriers towards opposite electrodes. As bias increases further, all photo-generated carriers are collected and the photocurrent saturates. As shown in the insert of FIG. 4 for one illumination level, this behavior can be rather closely simulated by the Hecht formula $J_{ph}=q\Phi\alpha L(E)(1-e^{-d/L(E)})$, where $\Phi$) is the photon flux, $\alpha$ the optical absorption coefficient, d the distance between electrodes and $L(E)=\mu\tau E$ is the drift length. For different illumination levels, the curves can be fit simply multiplying $J_{ph}$ by a constant. However, this constant is not proportional to the light intensity. This suggests that absorption coefficient of these SiGe undulating structures is dependent on the light intensity.

Figure 5A:
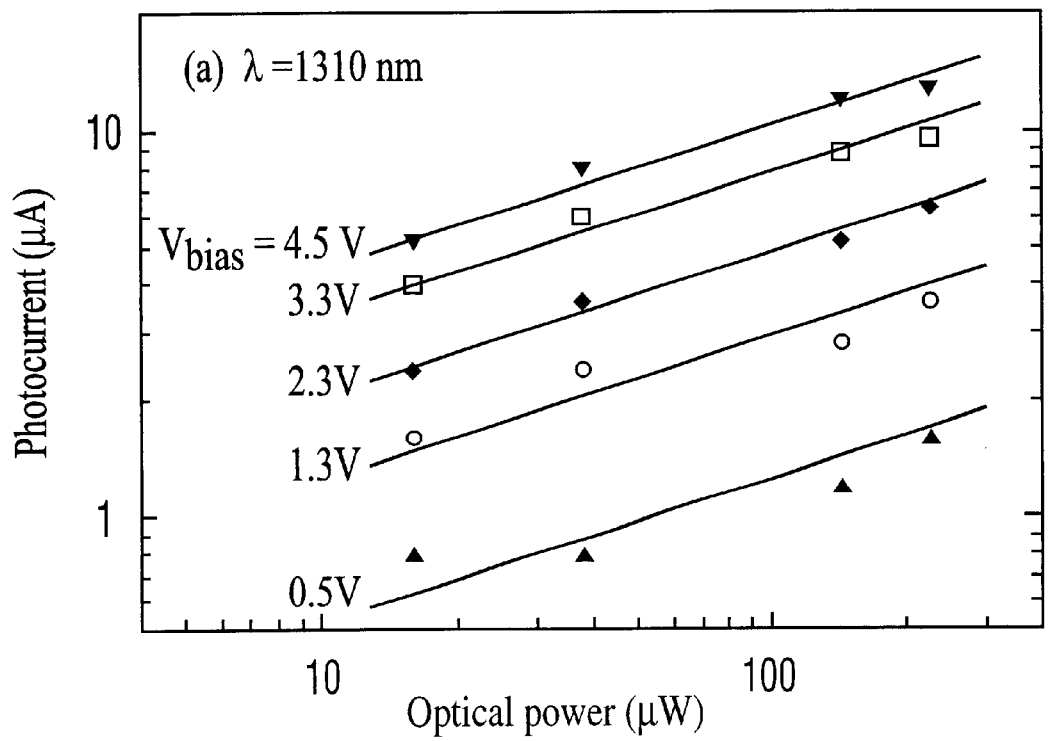
FIGS. 5(a) and 5(b) show the dependence of photocurrent on light intensity for 1310 nm and 1520 nm wavelengths respectively.
Figure 5B:
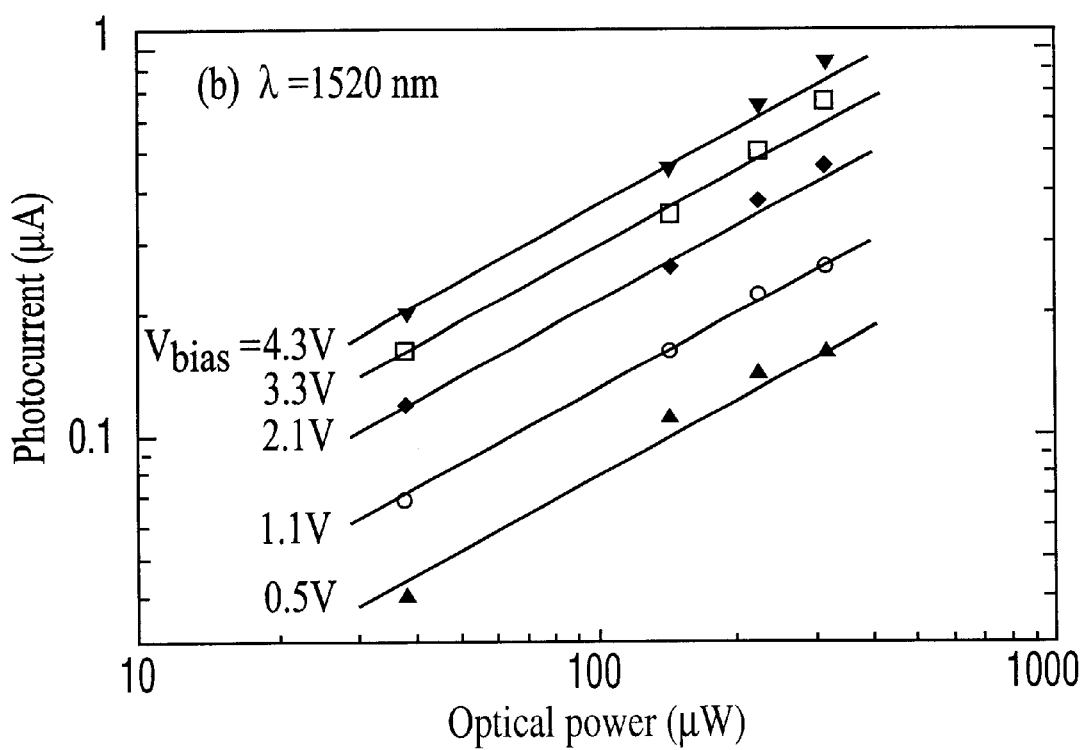

For 1520 nm wavelength, the basic behaviors of the photocurrent dependence on electrical field are similar to that at 1310 nm wavelength. Photocurrent increases initially and then saturates at high bias. However, the photocurrents exhibited a maximum at the bias range of 4.5 V–5.5 V, for both bias polarities. This feature is more pronounced for higher illumination levels, but the bias point for the maximum stays basically unchanged. Closely examining the photocurrent dependence on bias for 1310 nm, a small maximum can also be observed, as can be seen in the insert of FIG. 4. The dependence of photocurrent on illumination levels for different bias is plotted in FIG. 5 for both 1310 nm wavelength (FIG. 5a) and 1520 mn wavelength (FIG. 5b). The intensity shown is the light out of the fiber. It was estimated that the coupling percentage between fiber and waveguide was typically in the range of 20% and could reach a maximum of 30%. On the log-log plots, the curves appear to be linear with rather consistent slopes. For both wavelengths the slopes are less than unity, and approximates a relationship of photocurrent $I_{p\sim P}{}^n$ (where P is optical power) with n$\approx$0.4 for 1310 nm and n$\approx$0.7 for 1520 nm. The increase of photocurrents saturates with light intensity, especially quickly for 1310 nn. These behaviors lead to a responsivity dependent on optical power for these detectors. The responsivity is higher at lower illumination. Within the ranges measured, the highest responsivity was 1.6 A/W at 1310 nm wavelength and 0.12 A/W at 1520 nm wavelength, using a coupling percentage of 30% to give a more conservative estimate of the responsivities. There seems to be some photoconductive gain. This may be related to the large dark current, and the detectors behave partially as photoconductors. The large difference in band offsets for electrons and holes in the Si/SiGe MQW's may have also contributed to this phenomenon. The origins of the sub-linear dependence of photocurrent on light intensity, as well as the existence of photoresponse maximum with bias, are not clear at this point. These results indicate the complexity of these SiGe MQW undulation structures, whose electrical/optical properties have not been studied in depth previously.

Figure 6:
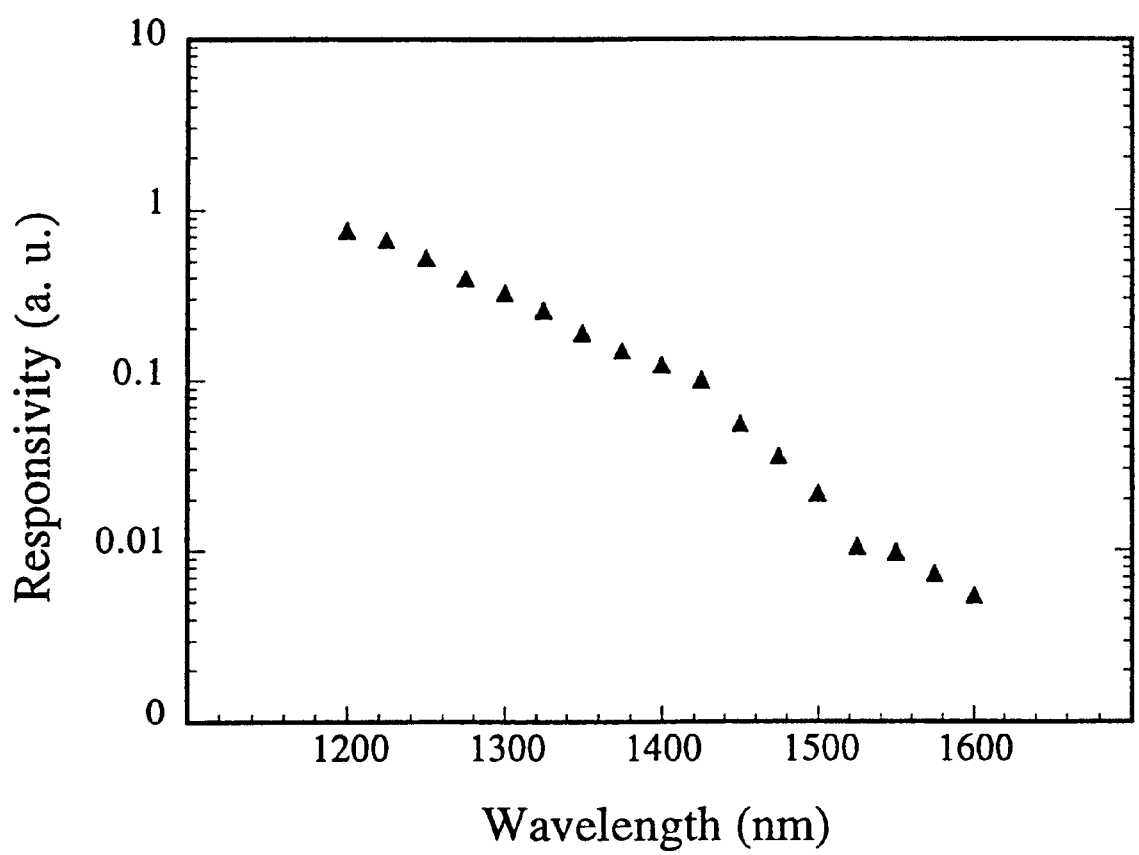
FIG. 6 shows the relative responsivity vs. wavelength using a monochromator as a light source.

FIG. 6 shows the spectral response of the photodetectors obtained with a monochromator. The device was biased at 5 V where the photoresponse for 1520 nm wavelength was near maximum. The response decreases almost exponentially with the wavelength. The ratio of responses between 1330 nm and 1550 nm is ~10, similar to the ratio obtained by coupling light from the lasers under low light intensity. How this ratio will vary with the Ge composition in the undulating layers is not yet clear, but is a direction worthwhile exploring. It is worth noting that the detectors have a reasonable response even at 1600 mn. In summary, MSM (Metal-Semiconductor-Metal) photodetectors using SiGe/Si undulating MQW's grown on SOI substrates have been demonstrated. Under appropriate growth conditions, strained SiGe QW's grow with periodic thickness variations along the surface plane. Ge tends to migrate towards the thickness maxima. It is shown that this increase in local Ge concentration and the reduced quantum confinement at the coherent wave crest produce strained QW's with significantly lower band-gaps compared to planar QW's with the same nominal composition. Photoluminescence spectra show the 'No Phonon' excitonic transition peaked at 0.785 eV (at 4°K), corresponding to a wavelength beyond 1.55 μm. Waveguide configuration on SOI substrates was used to increase the absorption length of the devices. The electrical behaviors of the detectors are basically similar to that of MSM detectors on homogeneous materials, although a current maximum vs. bias was observed, which was particularly pronounced for 1520 nm illumination. The responsivity of the detectors was also found to be higher at lower light intensity. Within the measured range, the maximum internal responsivity obtained were 1.6 A/W for 1310 nm wavelength and 0.12 A/W for 1520 nm wavelength, assuming 30% coupling between the fiber and the waveguides. It is believed that the responsivity at 1520 nm is the highest reported in SiGe or Ge systems so far.

We claim:

1. A method of fabricating a photonic device comprising the steps of:

providing a substrate; and providing a quantum well structure on said substrate by alternately growing layers of a first material and a second material providing a barrier layer, said first material forming quantum wells and comprising at least two components, and said layers of said first material being grown in a three dimensional morphology growth mode such that the thickness of said layers of said first material varies over the surface thereof to reduce local strain energy and increase local concentrations of one of said components.

2. A method as claimed in claim 1, wherein said layers of said first material have an undulating thickness.

3. A method of fabricating a photonic device comprising the steps of:

providing a substrate; and forming a quantum well structure on said substrate by alternately growing layers of a first material having an undulating thickness and forming quantum wells in a three dimensional morphology growth mode such that the thickness of said layers of said first material varies over the surface thereof to reduce local strain energy, and a second material providing a barrier layer; and wherein said undulating layers are formed with coherent wave thickness modulations.

4. A method as claimed in claim 3, wherein said substrate is silicon.

5. A method as claimed in claim 1, wherein said components of said first material comprise Si and Ge in the form $Si_{1-x}Ge_x$ and said second material Si.

6. A method as claimed in claim 5, wherein x is about 0.5.

7. A method as claimed in claim 6, wherein the layer thicknesses are selected such that the device has a photoresponse at 1550 nm.

8. A method as claimed in claim 1, wherein said quantum well forming layers are grown using ultrahigh vacuum chemical vapor deposition.

9. A method as claimed in claim 1, wherein said photonic device is a photodetector.

10. A method as claimed in claim 1, wherein said layers are formed by epitaxial growth.

11. A method as claimed in claim 1, wherein said quantum well structure is part of a waveguide structure formed on said substrate.

12. A method as claimed in claim 1, wherein said waveguide structure is formed-by etching said layers of first and second material.

* * * * *